United States Patent [19]

Edelstein

[11] Patent Number: 4,532,474

[45] Date of Patent: Jul. 30, 1985

[54] NUCLEAR MAGNETIC RESONANCE IMAGING USING PULSE SEQUENCES COMBINING SELECTIVE EXCITATION AND DRIVEN FREE PRECESSION

[75] Inventor: William A. Edelstein, Schenectady, N.Y.

[73] Assignee: General Electric Company, Schenectady, N.Y.

[21] Appl. No.: 530,810

[22] Filed: Sep. 9, 1983

[51] Int. Cl.³ .................................. G01R 33/08
[52] U.S. Cl. .................................. 324/309; 324/312
[58] Field of Search .............. 324/300, 307, 309, 312, 324/313, 314

[56] References Cited

U.S. PATENT DOCUMENTS

| 4,318,043 | 3/1982 | Crooks | 324/309 |
| 4,431,968 | 2/1984 | Edelstein | 324/309 |
| 4,484,138 | 11/1984 | Bottomley | 324/307 |

Primary Examiner—Michael J. Tokar
Attorney, Agent, or Firm—Lawrence D. Cutter; James C. Davis, Jr.; Marvin Snyder

[57] ABSTRACT

An improved nuclear magnetic resonance (NMR) imaging method using selective excitation in conjunction with driven free precession (DFP) to form two or three-dimensional images is disclosed. The combination of these techniques enables a plane section to be selected and subsequently reconstructed from multiple angle projections by known multiple angle reconstruction techniques such as are used in X-ray computed tomography. Alternatively the plane sections can be reconstructed using known Spin Warp or Fourier Transform Zeugmatography methods to produce a map of the spin density of the material, or a combination of spin density of the material, or a combination of spin density and relaxation times of the material in the selected plane. The improved imaging technique is particularly applicable to the detection and localization of various disease states of biological tissue which exhibit altered relaxation times.

10 Claims, 10 Drawing Figures

PHASE ENCODING GRADIENT

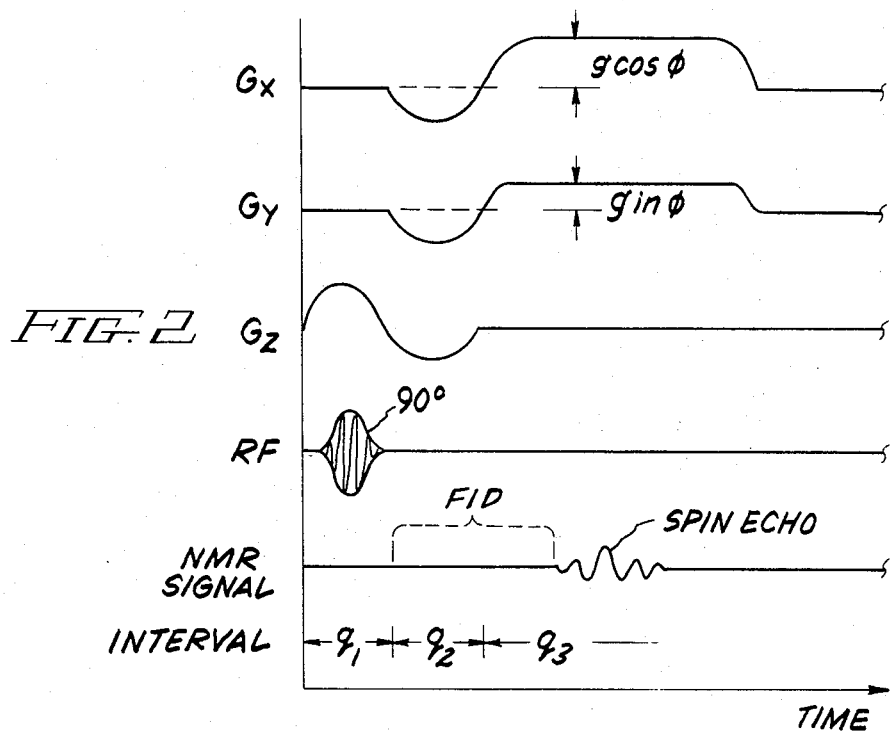
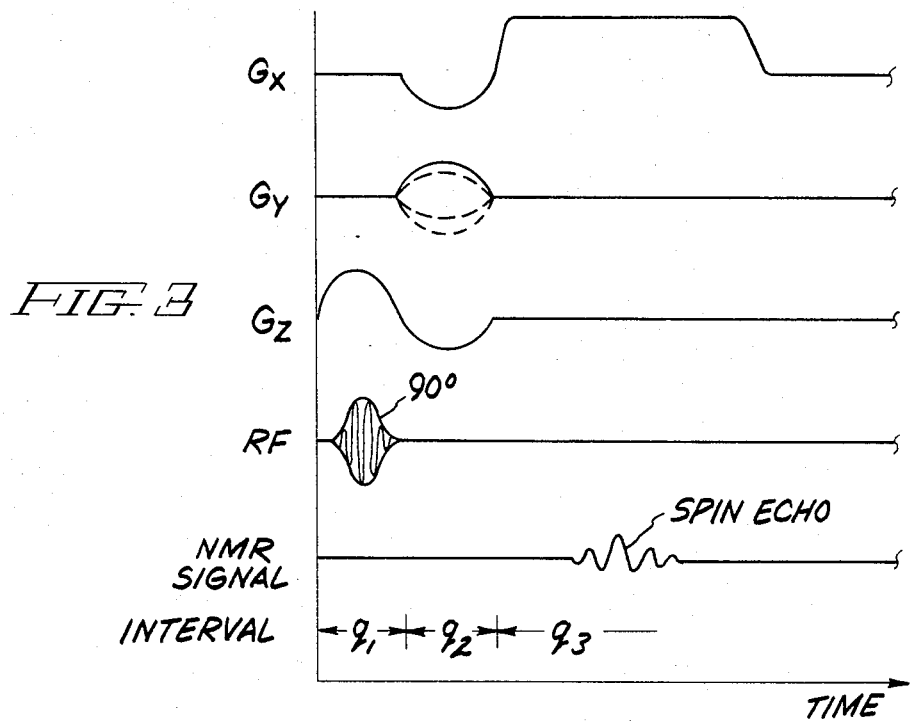

NUCLEAR MAGNETIC RESONANCE IMAGING USING PULSE SEQUENCES COMBINING SELECTIVE EXCITATION AND DRIVEN FREE PRECESSION

BACKGROUND OF THE INVENTION

I. Field of the Invention

The present invention relates generally to the use of selective excitation in conjunction with driven free precession (DFP) to form nuclear resonance (NMR) images. In particular, the present invention relates to the combination of the aforenoted two NMR techniques to effect the selection of a plane section, which is subsequently reconstructed from multiple angle projections by known multiple angle reconstruction techniques such as are used in X-ray computed tomography. Alternatively, the plane section can be reconstructed using known Spin Warp, or Fourier Transform Zeugmatrography, methods to produce a map of the spin density, or a combination of spin density and relaxation times of the materials in the selected plane.

II. Description of the Prior Art

NMR imaging as a medical diagnostic tool offers a number of important advantages over the various other means available for probing the human body. The most significant of these advantages result from the completely non-invasive nature of the technology, and the ability to obtain spatially encoded specimen data with a high degree of precision. Additionally, NMR has minimal, if any, hazards for either patients or operators of the apparatus; and perhaps most importantly, NMR image intensities are increasingly being found to be sensitive to various disease states. Clinical studies now underway are noting that the relaxation time of malignant tissues are in general longer than those of the tissues of origin. This property is apparently not unique to cancerous tissue, but rather is indicative of the changes in molecular level structure of water associated with certain disease states. Other pathologies of NMR imaging include hydrocephalis; a carotid artery aneurysm; edema associated with kidney transplants; and liver cirrhosis.

The interested reader is referred to a recent article titled "Spin Warp NMR imaging and applications to human wholebody imaging" by William A. Edelstein et al, Physics in Medicine and Biology, 25, pp 751-756 (1980); and further to "Nuclear magnetic resonance: beyond physical imaging" by Paul A. Bottomley, IEEE Spectrum, Vol. 20, no. 2, pp 32-38, (1983). More complete treatments of basic NMR concepts are provided in a recent text edited by Leon Kaufman et al., "Nuclear Magnetic Resonance Imaging and Medicine", Igaku-Shoin, New York and Tokyo (1981); and also in an earlier text by Thomas C. Farrar et al., "Pulse and Fourier Transform NMR, An Introduction to Theory and Methods", Academic Press, New York (1971).

In general, known NMR techniques for imaging of body tissue have tended to be of somewhat limited image quality, spatial resolution, and have required comparatively long patient exposure times to complete. In view of these technical and medical considerations, it is clearly of importance to improve NMR imaging technology by all available means. In particular, signal to noise ratios need to be increased, imaging times need to be shortened, spatial resolution needs to be enhanced, and imaging of the transverse and/or longitudinal relaxation times need to be accomplished. Many of these factors are not mutually exclusive. As a result, there has been a tendency to trade an improvement in one factor to the detriment of others. These trade offs are not always salutory, further pointing up the need for basic improvements in NMR methods and apparatus.

The coined term Zeugmatography is presently being used to cover an increasing range of NMR techniques wherein static magnetic fields (to produce polarization of nuclei) are combined with field gradients (to spatially encode the sample volume of interest) and with RF fields (to spatially reorient polarized nuclei) to achieve a wide range of objectives, including imaging. In the recept past, the technical and patent literature have burgeoned reporting results of successive advances in the fields. While the field has progressed steadily, certain intrinsic drawbacks have heretofore precluded the use of NMR high resolution imaging in medicine. Chief among these are comparatively slow relaxation times of human tissue, and body motion due both to inherent movements within the body as well as the difficulty of keeping the body stationary for long periods of time.

Biological tissue is known to have longitudinal (or spin-lattice) relaxation times $T_1$, and transverse (or spin-spin) relaxation times $T_2$, in the range of 0.04 to 3 seconds. Both of these times constants are exceedingly long as compared to the speed of the instrumentation presently available to process NMR signals. Also, high resolution imaging requires a large number of pixels, each of which may be the result of a complete NMR pulse projection, where each NMR projection is at least influenced by if not limited by these long time constants.

One of the fundamental limitations to NMR imaging of the whole human body is the relatively low signal to noise ratio of the NMR signals coming from body tissues. DFP is a good way to get maximum information gathering rate from an NMR experiment, and thus is attractive for imaging purposes.

Heretofore DFP has been used to make tomographic-like section images by applying a sinusoidally oscillating gradient perpendicular to the selected slice in the sample of interest. (See, for example, H. R. Brooker and W. S. Hinshaw, J. Mag. Res. 30, 129-131.) As described, the DFP signal is averaged over time, and the signal produced by spins distant from the null plane (of the oscillating gradient) average to zero. This technique has a number of disadvantages, a primary one being that in order to get a desired plane thickness and signal to noise ratio, there is a minimum time over which the average must be taken in order to minimize the signal from outside the selected plane. Also, the thickness of the plane at any location depends on the ratio of the longitudinal/transverse relaxation times ($T_2/T_1$) of the sample; and under certain conditions there is a significant contribution from spins outside the slice of interest. The effect of these unwanted signals can be large and is only limited by the finite size of the sample and the finite spatial extent of the radio frequency fields employed. Additionally, there is no good way in these prior art methods to define an extended region perpendicular to the selected slice, or to obtain spatial information in the thickness direction of a slice.

Selective excitation has been used to select a plane for imaging. However, prior art schemes using selective excitation have required time delays approximately equal to (or greater than) the longitudinal relaxation time $T_1$, which generally degrades the signal to noise ratio of the overall NMR data acquisition process. No prior art schemes are known which combine DFP and selective excitation and produce imaging pulse sequences.

The present invention teaches the use of new NMR imaging sequences based on advantageously combining known sequences in particular modes, and is specifically directed to produce a substantial improvement in the heretofore available image signal to noise ratio by maximizing the information gathering rate from an NMR pulse sequence; and/or produce a 2D or 3D image, responsive both to the spin density and to the longitudinal relaxation time $T_1$ of the sample under study.

SUMMARY OF THE INVENTION

It is therefore a primary object of the present invention to provide improved methods for NMR imaging using driven free precession in conjunction with selective excitation.

Another object of the present invention is to provide improved methods of two- or three-dimensional NMR imaging using the above mentioned NMR techniques and employing Spin Warp or Fourier Transform Zeugmatography methods of image reconstruction.

Yet another object of the present invention is to obtain an increased data gathering rate from an NMR pulse sequence thereby improving the signal to noise ratio of images produced.

A still further object of the present invention is to increase the data gathering rate from NMR pulse sequences so as to reduce the time required to produce a map of the spin density or a combination of spin density and relaxation times of the materials under investigation.

The present invention describes an improved NMR imaging method using variable angle selective excitation in conjunction with driven free precession to form two or three-dimensional images at an increased data gathering rate per image. Combining these NMR techniques in particular modes enables a plane section to be selected and subsequently reconstructed from multiple angle projections by known multiple angle reconstruction techniques such as are used in X-ray computed tomography. Alternatively, the plane section may be reconstructed using known Spin Warp or Fourier Transform Zeugmatography methods. These images produce a map of the spin density of the material, or a combination of spin density and relaxation times of the material in the selected plane. The improved imaging technique is particularly useful when directed to the detection and localization of various disease states of biological tissue.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof may best be understood by reference to the following description taken in connection with the accompanying drawings in which:

FIG. 2 depicts a conventional NMR pulse sequence used in multiple angle projection reconstruction imaging methods;

FIG. 3 depicts a conventional NMR pulse sequence used in Spin Warp imaging methods;

DETAILED DESCRIPTION OF THE PREFERRED EMBODIMENTS

Prior to a description of the improved NMR imaging methods employed to practice the present invention, it is instructive to consider the various stages of the imaging process. The four main stages are: sample excitation; spatial differentiation; signal reception and processing; and image reconstruction. Emphasis is placed herein on the first two of these stages during which the most novel features of the present invention come into play. It is also useful at this point to provide a very brief overview of the basic NMR techniques of selective excitation, multiple angle projection, and spin warp imaging, modified version of which are advantageously employed in the preferred embodiments of the present invention.

Figure 1:
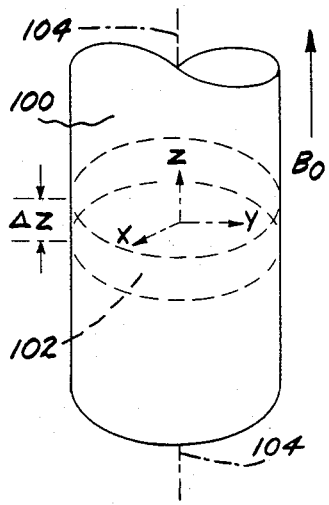
FIG. 1 illustrates a sample material situated in a static magnetic field and having a thin planar volume defined therein by selective excitation.

Basic pulse sequences for NMR imaging by multiple angle projection reconstruction methods are described with reference to FIGS. 1 and 2. Since these are related to planar methods, it is therefore required that the NMR data collecting process be localized to a thin planar slice of thickness $\Delta Z$, termed the imaging plane. A thin planar slice of spins is defined by the well known selective excitation method. Briefly, a narrow frequency band, 90° selective RF pulse is applied during period $q_1$ in the presence of a positive gradient $G_z$. The RF pulse could, for example, be in the form of a Gaussian amplitude modulated RF carrier, as shown, in which case the thin planar region $\Delta Z$ of FIG. 1 would have a Gaussian profile. The RF pulse could also take on the form of a carrier modulated by a pulse envelope of the form sin (Ct)/(Ct), in which t is time and C is a constant. In the latter case, the thickness profile of the selected slice would be substantially rectangular. In interval $q_2$, a negative $G_z$ lobe is applied to rephase the spins excited in interval $q_1$. Also in interval $q_2$, negative dephasing gradients $G_x$ and $G_y$ are applied in the x and y coordinate directions, respectively. The NMR data are collected by observing a form of spin echo in interval $q_3$ as shown, in the presence of simultaneously applied imaging gradients $G_x$ and $G_y$ injected along the x and y axis directions, respectively. In the absence of the dephasing gradients, a free induction decay (FID) signal is present (ideally) beginning immediately at the end of the $q_2$ interval as indicated by the dash lines. The amplitudes of the imaging gradients $G_x$ and $G_y$ are constant during any one interval $q_3$, but vary as $g \cos \theta$ and $g \sin \theta$ respectively between successive projection sequences.

Figure 4A:
FIG. 4A schematically illustrates a column of spins aligned in the y direction in the planar volume depicted in FIG. 1.
Figure 4B:
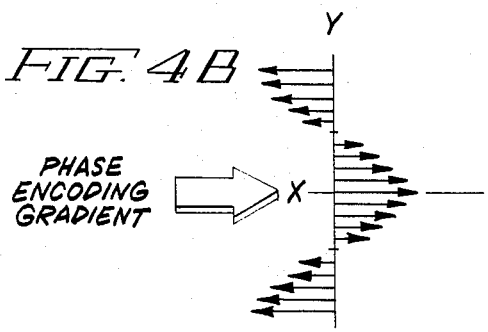
FIG. 4B schematically illustrates the phase changes in the arrangement of FIG. 4A resulting from the application of a phase encoding gradient along the y-axis.

Reference is now made to FIGS. 3, 4A, and 4B which illustrate the Spin Warp NMR pulse sequence which may also advantageously be used with the improved imaging methods of the present invention. As before, a thin planar slice of spins orthogonal to the z-axis are selected by the 90° selective excitation scheme previously described, and the spins are flipped into the transverse plane. Following the 90° RF pulse, a negative $G_z$ gradient is applied to rephase the spins as before. During the time $q_2$, a negative $G_x$ dephasing gradient may be applied, which also delays the occurrence of the NMR signal.

A phase encoding programmable amplitude gradient $G_y$ in the Y-axis direction is used during the interval $q_2$ to encode phase information by introducing a twist in the spins along the Y-axis direction. FIG. 4A shows the profile of the Y-axis spins before the application of the phase encoding gradient. Following the application of a first $G_y$ gradient, the spins are twisted into a one turn helix as shown in FIG. 4B. The spatial information encoded by the different phases of the spins is read out by the application, during interval $q_3$, of a $G_x$ gradient which causes spins at different X positions to precess at different frequencies, enabling the separation of the signals along the X direction. This is essentially a projection of the spin information onto the X-axis. The entire pulse sequence is repeated for each projection by different predetermined values of $G_y$ which twist the spins into different multiple turned helices. Each projection contains different information because of the different $G_y$ phase encoding gradients used. This $G_y$ pulse amplitude change per projection is indicated in FIG. 3 by the dashed lines depicting sequential application of different $G_y$ encoding gradients for successive projections. Upon completion of a full set of projections (for example, about 128) the complete planar image is reconstructed by a two-dimensional Fourier transform algorithm operating on all NMR data in the projections. As in the aforedescribed multiple angle projection reconstruction imaging method, the various rephasing and dephasing lobes do not reverse the dephasing of the nuclear spins due to the inherent magnetic field inhomogeneities, resulting eventually in an inevitable loss in NMR signal intensity due to the effects of the transverse relaxation time $T_2$. Although the magnetic field gradients are depicted in the various intervals as positive halves of a sinusoid, they can be of any shape providing certain well known amplitude relationships are satisfied. For example, the gradients lobes could have either a Gaussian or a substantially rectangular configuration.

Figure 5B:
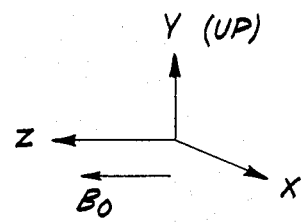
FIG. 5B illustrates the coorinate system applicable to the pulse sequences in FIG. 5A.
Figure 5A:
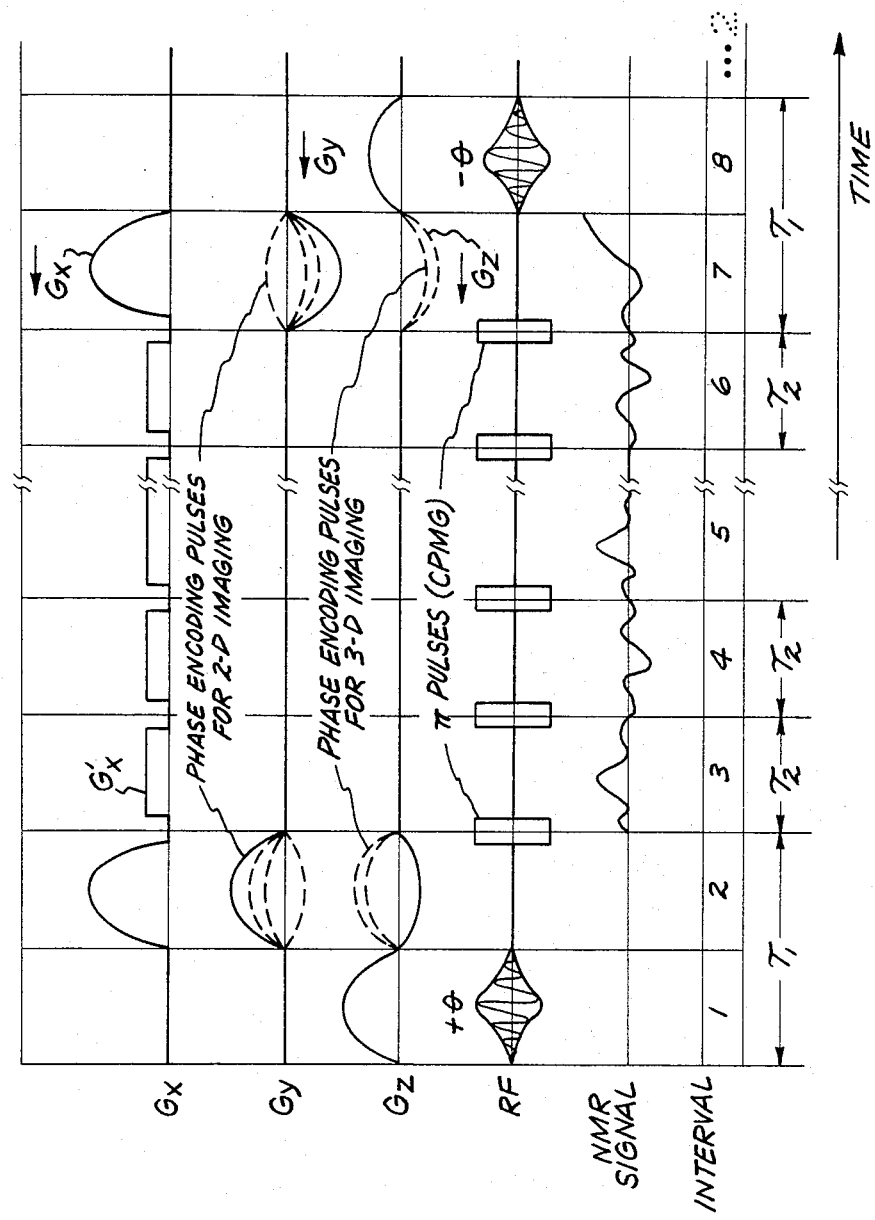
FIG. 5A illustrates a preferred NMR pulse sequence including DFP and selective excitation to form NMR images according to the present invention.

Referring now to FIG. 5A, there is shown a preferred NMR pulse sequence including DFP and selective excitation to form planar section images according to the present invention. FIG. 5B shows the applicable coordinate system for this pulse sequence. The system of FIG. 5B is similar to that of FIG. 1 with the exception that the local vertical direction is moved (for mere convenience of description) to be along the y direction. As before, the static magnetic field $B_0$ is directed along the z direction, and the usual convention of a rotating x-y-z frame is employed.

In the first interval in FIG. 5A, a narrow frequency band RF pulse, $+\theta$ is applied as shown along the RF axis in the presence of a positive z-gradient lobe $G_z$. The RF pulse may, illustratively, be in the form of a Gaussian modulated RF carrier, in which case the slice thickness whould have a Gaussian profile. Another alternative is to have the RF pulse amplitude proportional to $\sin(Ct)/Ct$ (as shown in FIG. 2) where C is a predetermined constant. In this case, the slice thickness would have a substantially rectangular profile. It is desirable to make interval 1 as short as possible since no useful signal is produced during this time. Considering typical apparatus limitations, a minimum time for interval 1 is nominally on the order of 0.1 milliseconds.

This RF pulse may be considered analogous to the conventional 90° selective excitation pulse in that it flips the nuclei within a particular slice of the sample; but the net magnetization within the slice is flipped to an angle $\theta$ other than 90°. The flip angle $\theta$ may fall within the range from 0° to 90°.

In the second interval, a number of pulsed magnetic field gradients are applied, the net effects of which are independent and additive as if they were applied sequentially. A negative $G_z$ lobe is applied to rephase the spins stimulated in interval 1. The positive z-gradient lobe $G_z$ and the negative rephasing lobe $G_z$ are adjusted such that $$\int_2 G_z dt = -\frac{1}{2} \int_1 G_z dt \qquad (1)$$

where the lower integration limit symbol for the integrals designates the associated interval.

A programmable amplitude phase encoding $G_y$ gradient is applied to enable spatial information in the y direction to be obtained. The four lobes shown (one solid and three dashed) illustrate some of the multiplicity of values of the phase encoding gradient that are used during imaging data acquisition. This family of waveforms must follow the rule that $\int G_y dt = 2k\pi$, where k is an integer. It is desired to divide the vertical axis (along the y-axis for this coordinate system) into N parts, then a possible series for k would be $$k = -\frac{n}{2}, -\frac{n}{2}+1, \ldots -1, 0, 1, \ldots \frac{n}{2}-1 \qquad (2)$$

A positive $G_x$ lobe is applied to dephase the spins so that the maximum signal occurs in the middle of interval 3, and not at the beginning of interval 3. This $G_x$ lobe then transitions into a constant x-axis imaging gradient value for intervals 3 and beyond, as is shown therein. The gradient signal $G_x$ is however turned off during application of the 180° (that is, $\pi$) pulses.

As before, the gradient lobes are depicted as portions of sinusoids, but they may take on other forms. Further, three-dimensional imaging information can be obtained by adding to the rephasing $G_z$ lobe, a phase encoding $G_z$ waveform of programmable amplitude which makes it possible to analyze the spatial information in the direction through the slice thickness, perpendicular to the plane of the slice. It is desirable to keep the interval 2 as short as possible as no useful signal is produced during this time. The total time for intervals 1 and 2 is designated as $\tau_1$.

Terminating interval 2 and beginning interval 3 is a short, sharp, noselective 180° RF pulse applied to produce a first spin echo signal during the interval 3. The RF pulse is the first of a Carr-Purcell-Meiboom-Gill (CPMG) sequence, consisting of alternating phase 180° pulses separated by the interpulse spacing of $\tau_2$. As shown in FIG. 5A, the constant imaging gradient $G_x'$ is maintained thereafter in order to produce a complex projection of the magnetization in the excited slice onto the x-axis. The series of short 180° pulses are applied at the ends of each of the successive intervals (3, 4, ...) to reverse the magnetization and to produce a corresponding spin echo during the next interval. Each of the successive intervals 3 through 6 are of duration $\tau_2$, corresponding to the 180° interpulse times. Successive spin echo signals are indicated as being in the center of their associated intervals, with their simplified envelopes depicting their carrier (Larmor frequency) phase reversals.

In interval 7, after an even number of intervals of the type 3-6, a 180° pulse is applied followed by various gradient lobes whose purpose is to return the spins to the condition they were in at the beginning of interval 2. Thus gradient lobes $G_x\leftarrow$, $G_y\leftarrow$ (and $G_z\leftarrow$ if applicable) are applied where the arrow notation implies that the lobes shown are the negative versions of the corresponding lobes applied in interval 2.

On achieving the condition corresponding to that at the beginning of interval 2, a particular DFP/selective excitation sequence is completed, and the sequence may then be repeated with different values of the phase encoding gradients $G_y$ or $G_z$ to get additional NMR information needed to produce an image. The intervals 3–6 may be, illustratively, from 1 to 10 milliseconds in duration (i.e., $1 \leq \tau_2 \leq 10$ ms). The time required for intervals 1–7 must be short as compared to the transverse relaxation time $T_2$ of the sample; illustratively, on the order of 10 to 50 milliseconds.

Interval 8 shows the application of a subsequent narrow band RF pulse, $-\theta$, in the presence of the positive z-gradient lobe $G_z$, which reinitiates the selective DFP sequence as described. Interval 8 would then be followed by an interval of the type 2, and thereafter by a number of intervals of the type 3-6 as before. While certain advantages may be achieved via alternating the phase of the $\theta$ RF pulse, overall data rate considerations must be balanced against these. Thus, a particular DFP/selective excitation sequence may include both alternating phase $\theta$ pulses for a single value of spin warp phase encoding pulse; or alternating phase $\theta$ pulses for successive phase encoding pulses; or non-phase alternating $\theta$ pulses for successive phase encoding pulses.

While the above sequence produces NMR data amenable to being reconstructed into a 2D image of spin density within the selected slice, other advantages are also inherent. The lengths of time between the 180° driving pulses can be varied to make the images sensitive to relaxation effects. In particular, by varying $\tau_2$, the resulting images may be made sensitive to a particular range of longitudinal relaxation times $T_1$, which may be known or suspected to be associated with particular pathologies of biological tissue.

Figure 6:
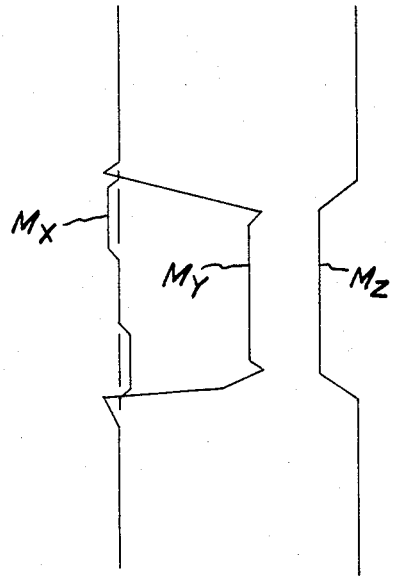
FIG. 6 shows the steady-state magnetization resulting from a selective excitation/DFP pulse sequence using positive and negative 39.8° pulses of the form sin (Ct)/(Ct), where C is a constant.
Figure 7:
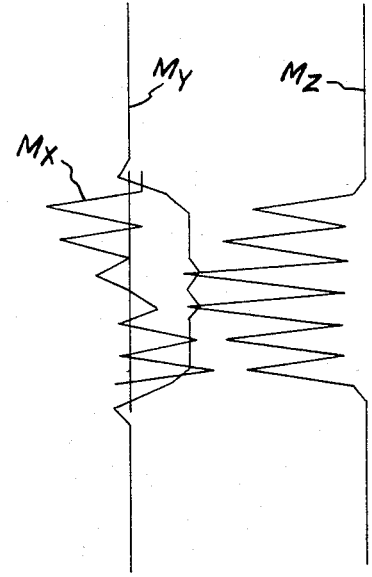
FIG. 7 shows the steady-state magnetization resulting from a selective excitation/DFP pulse sequence using positive and negative 39.8° pulses of the form exp $(-Ct^2)$, where C is a constant.

Computer simulation has determined the efficacy of the combination of NMR techniques detailed above for various experimental parameters. Referring to FIGS. 6 and 7, there are shown values of the steady-state magnetization resulting from selective excitation/DFP pulse sequences for optimum $\theta$ values. FIG. 3 shows the $M_x$, $M_y$ and $M_z$ components of magnetization using positive and negative 39.8° $\theta$ pulses of the form sin (Ct)/(Ct) in a DFP sequence. Of particular interest is the substantially rectangular profiles of $M_y$ and $M_z$. The flip angle is chosen to be optimum for a $T_2/T_1$ ratio of 0.25. This profile is seen to be useful for three-dimensional imaging. Thus the present invention also has the advantage of accommodating a 3D imaging procedure which uses the DFP techniques, as distinguished over known prior art methods which do not suggest this capability.

FIG. 4 shows the $M_x$, $M_y$ and $M_z$ components of magnetization using positive and negative 39.8° RF pulses of the form $\exp(-Ct^2)$ in a DFP sequence. Of interest is the substantially rectangular profile of the $M_y$ component, despite the Gaussian waveform. Phase variation of $M_x$ is noted throughout the slice profile. Hence, the Gaussian RF pulse is suitable for single slice imaging, but may not be ideal for three-dimensional imaging.

There is an advantage of using the Spin Warp method with DFP rather than multiple angle projection reconstruction which is done at present. In the multiple angle projection scheme, curved projecting lines (which are almost inevitable because of magnetic field inhomogeneities) can cause smearing of imaging information and consequent loss of spatial resolution. In the Spin Warp method, all projections are along the same projecting lines. Hence curvature can at worst cause geometric distortion of the final image but not smearing of imaging information.

Figure 8:
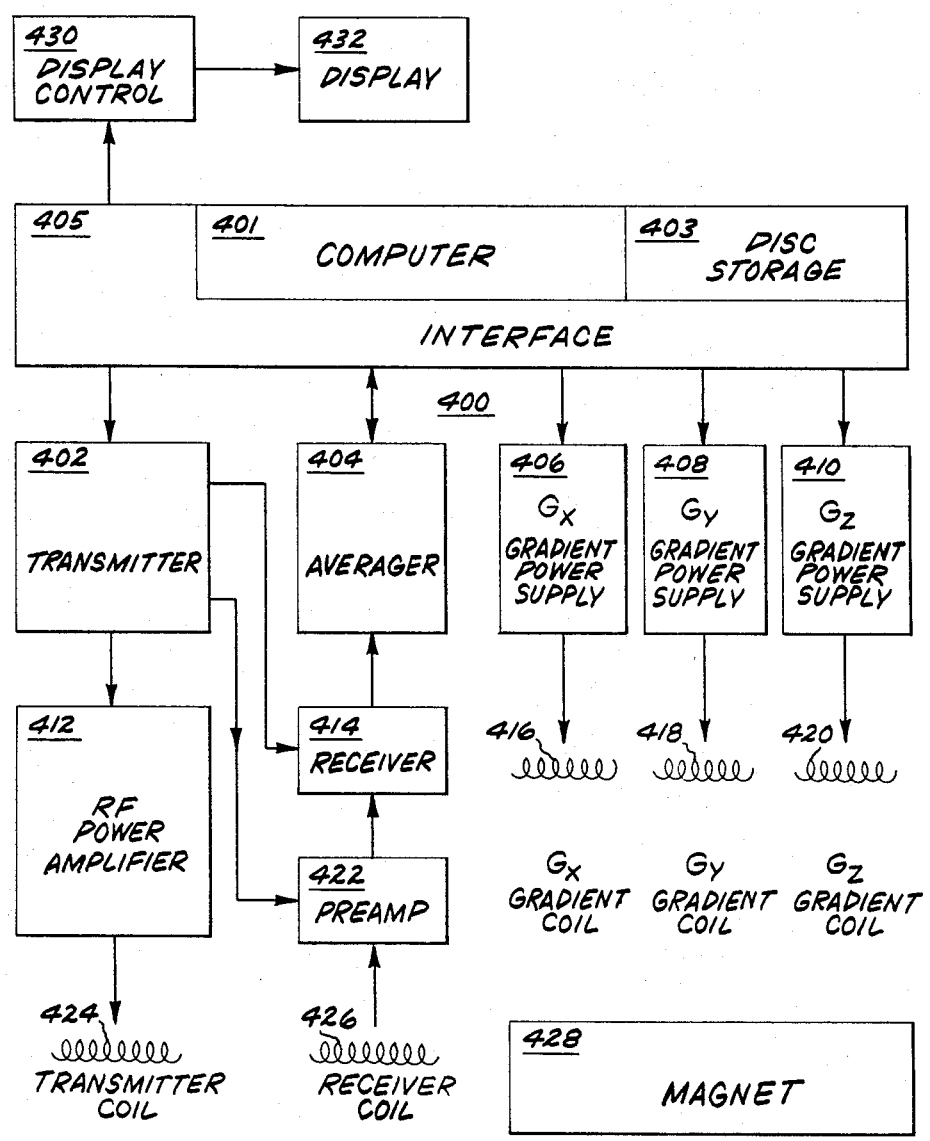
FIG. 8 is a simplified block diagram showing the major components of an NMR imaging apparatus suitable for implementing the pulse sequences and data handling needs of the present invention.

FIG. 8 is a simplified block diagram showing the major components of an NMR imaging apparatus suitable for implementing the selective excitation/DFP pulse sequences and data handling needs of the present invention. The overall system, generally designated 400, is made up of a general purpose minicomputer 401 which is functionally coupled to a disc storage unit 403, and an interface unit 405. An RF transmitter 402, signal averager 404, and gradient power supplies 406, 408, and 410 are coupled to the computer 401 through interface unit 405. The three gradient power supplies are used for energizing, respectively, a set of X, Y, and Z gradient coils 416, 418, and 420.

The RF transmitter 402 is gated with pulse envelopes from computer 401 to generate RF pulses having the required modulation to excite resonance in the sample being imaged. The RF pulses are amplified in an RF power amplifier 412 to levels varying from 100 watts to several kilowatts, depending on the imaging method, and are applied to a transmitter coil 424. The high power levels are necessary for large sample volumes such as are encountered in whole body imaging, and where short duration pulses are required to excite NMR frequency bandwidths.

The resulting NMR signal is sensed by a receiver coil 426, amplified in a low noise preamplifier 422, and thereafter routed to a receiver 414 for further amplification, detection, and filtering. This groomed NMR signal is then digitized and averaged by the signal averager 404, and routed to computer 401 for further processing. The processed signals are routed from the computer 401 via the interface 405 to a display control unit 430 where they are stored, reformatted and applied to a display unit 432. The display unit 432 may include a variety of data presentation means, such as CRT-type displays, as well as hard copy devices. The CRT displays may comprise direct viewing storage tube (DVST) types and conventional black and white or color TV-like CRTs. These displays may include directly viewable calibration traces and the like. The hard copy output devices may comprise printers such as line printers, TTY terminals, and photographic image producers.

The preamplifier 422 and receiver 414 are protected from the RF pulses during transmission by active disabling gating and/or by passive filtering. Computer 401 provides gating and envelope modulation for the NMR pulses, blanking for the preamplifier and RF power amplifier, and voltage waveforms for the gradient power supplies. The computer 401 performs data processing such as Fourier transforms, image reconstruction, data filtering, image display, and storage functions, all of which are well known and do not form an intrinsic part of the present invention.

The transmitter and receiver RF coils may be configured as a single coil. Alternatively, two separate coils that are electrically orthogonal may be used. The latter configuration has the advantage of reduced RF pulse breakthrough into the receiver during pulse transmission. In both cases, the coils are orthogonal to the direction of the static magnetic field $B_0$ produced by a magnet 428. The coils are isolated from the remainder of the system by enclosure in an RF shielded cage. Three typical RF coil designs are illustrated in a co-pending application assigned to the same assignee as the present invention, bearing Ser. No. 345,444 filed on Feb. 3, 1982, and entitled "METHOD OF NMR IMAGING WHICH OVERCOMES $T_2^*$ EFFECTS IN AN INHOMOGENEOUS STATIC MAGNETIC FIELD". All of the coils depicted therein as FIGS. 11A, 11B and 11C produce RF magnetic fields in the x direction, and the coil designs illustrated in FIGS. 11B and 11C are suitable for magnetic geometries for which the axis of the sample chamber is parallel to the main field $B_0$ as shown in FIG. 1 of the present invention. The coil design illustrated in FIG. 11A is applicable to geometries for which the sample chamber axis is perpendicular to the main field $B_0$.

Magnetic field gradient coils 416, 418, and 420 are necessary to provide the $G_x$, $G_y$, and $G_z$ gradients respectively. In the multiple angle projection reconstruction and spin-warp methods described above, the gradients should be monotonic and linear over the sample volume. Multi-valued gradient fields cause a degradation in the NMR signal data, known as aliasing, can lead to severe image artifacts. Nonlinear gradients cause geometric distortions of the image. A design for gradient coils suitable for magnet geometries with a sample chamber axis parallel to the main field $B_0$ is depicted in FIGS. 12A and 12B (of aforementioned application Ser. No. 345,444). Each of the gradients $G_x$ and $G_y$ is produced by a set of coils such as the set 300 and 302 depicted in FIG. 12A. The coil sets as illustrated in FIG. 12A produce gradient $G_x$. The coil sets for producing gradient $G_y$ are rotated 90° around the cylindrical axis (axis 104 of FIG. 1) of the sample chamber relative to the coil that produces the gradient $G_x$. The Z gradient is generated by a coil pair such as coils 400 and 402 shown in the abovementioned FIG. 12B.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of generating NMR image data using driven free precession and selective excitation for producing images having an increased data rate, comprising:
   (a) selectively exciting a planar slice within a sample at a flip angle which optimizes the NMR signal for some ratio of transverse to longitudinal relaxation times within said sample;
   (b) injecting a programmable amplitude imaging gradient along a first axis within said slice and injecting a dephasing gradient along a second axis within said slice and orthogonal to said first axis;
   (c) applying an alternatingly phased series of 180° nonselective pulses to said sample at predetermined intervals to produce a corresponding series of spin echo signals in the intervals between said pulses, said intervals being significantly shorter than the transverse relaxation time in said sample;
   (d) restoratively injecting imaging and rephasing gradients, said gradients being injected along respective axes corresponding to, and configured to be the negative versions of, those gradients of step (b); and
   (e) said steps (a) selectively exciting, (b) injecting, (c) applying, and (d) restoratively injecting being done for each of a succession of projections, said programmable imaging gradient being distinct for each said succession of projections and said intervals containing a predetermined imaging gradient along a second axis within said slice and orthogonal to said first axis which is substantially constant for all of said succession of projections.

2. The method of claim 1 further comprising the steps of converting each of said successive series of spin echo signals into a time series of values and transforming said time series of values into frequency domain data and formatting said frequency domain data into modified data for facilitating presentation thereof as two-dimensional images.

3. The method of claim 2 wherein said injecting step further comprises the steps of injecting a second programmable imaging gradient along an axis orthogonal to said planar slice, and said restoratively injecting step further comprises injecting a negative version of said second programmable imaging gradient, and said transforming step includes an additional transformation thereby facilitating the presentation of said modified data as three-dimensional data.

4. The method of claim 1 wherein the ratio of average transverse to average longitudinal relaxation times within said sample is between the range of 1:2 and 1:10 and said flip angle is in the range of 30° to 50°.

5. The method of claim 4 wherein said sample is comprised of biological tissue having an average ratio of transverse to longitudinal relaxation times of approximately 1:4 and said corresponding flip angle is approximately 40°.

6. A method of generating NMR multi-dimensional image data using driven free precession and varied flip angle selective excitation for producing images, comprising:
   (a) selectively exciting a planar slice within a sample at a flip angle varied to optimize the signal for some ratio of transverse to average longitudinal relaxation times within said sample;
   (b) injecting a rephasing gradient along an axis orthogonal to said planar slice and at least one dephasing gradient along at least one of two orthogonal axes contained wholly within said slice;

(c) applying an alternatingly phased series of 180° nonselective pulses to said sample at predetermined intervals significantly shorter than said average transverse relaxation time to produce a corresponding series of spin echo signals in the intervals between said pulses;

(d) said selectively exciting, applying, and injecting steps being done for each of a succession of projections and said intervals containing distinct imaging gradients for each of said succession of projections; and (e) restoratively injecting a like number of gradients as injected in step (b), said restoratively injected gradients injected along respective axes corresponding to, and configured as the negative versions of, the gradients of step (b).

7. The method of claim 6 further comprising the steps of converting each of said successive series of spin echo signals into a time series of values and transforming said time series of values into frequency domain data and reformatting said frequency domain data into modified data for facilitating presentation thereof as two-dimensional images.

8. The method of claim 6 wherein said sample is comprised of biological tissue having an average ratio of transverse to longitudinal relaxation times of approximately 1:4 and said corresponding flip angle is approximately 40°.

9. A method of generating NMR image data using driven free precession and selective excitation for producing images having an increased data rate, comprising:

(a) selectively exciting a planar slice within a sample at a first flip which optimizes the NMR signal for some ratio of transverse to longitudinal relaxation times within said sample;

(b) injecting a programmable amplitude imaging gradient along a first axis within said slice and injecting a dephasing gradient along a second axis within said slice and orthogonal to said first axis;

(c) applying a series of 180° nonselective pulses of alternating phase to said sample at predetermined intervals to produce a corresponding series of spin echo signals in intervals between said pulses, said intervals being significantly shorter than the average transverse relaxation time in said sample;

(d) restoratively injecting imaging and rephasing gradients, said restorative gradients injected along respective axes corresponding to, and configured to be the negative versions of, those gradients of step (b);

(e) selectively exciting the same planar slice for a second time at a second flip angle which is opposite in sign to the first flip angle; and (f) repeating steps (b), (c), (d) and (e) for each pair of a succession of projections, said programmable imaging gradient being distinct for each pair of said succession, and said intervals containing a predetermined imaging gradient along a second axis wholly within said slice and orthogonal to said first axis which is substantially constant for all of said succession of projections.

10. The method of claim 9 further comprising the steps of converting each of said pairs of successive series of spin echo signals into a time series of values and transforming said time series of values into frequency domain data and reformatting said frequency domain data into modified data for facilitating presentation thereof as two-dimensional images.

* * * * *